United States Patent
Gessert et al.

(10) Patent No.: US 8,425,978 B2
(45) Date of Patent: Apr. 23, 2013

(54) FLUORINE COMPOUNDS FOR DOPING CONDUCTIVE OXIDE THIN FILMS

(75) Inventors: Tim Gessert, Conifer, CO (US);
Xiaonan Li, Evergreen, CO (US);
Teresa M. Barnes, Evergreen, CO (US);
Robert Torres, Jr., Parker, CO (US);
Carrie L. Wyse, Longmont, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 47 days.

(21) Appl. No.: 12/884,490

(22) Filed: Sep. 17, 2010

(65) Prior Publication Data

US 2011/0070371 A1  Mar. 24, 2011

Related U.S. Application Data

(60) Provisional application No. 61/244,305, filed on Sep. 21, 2009.

(51) Int. Cl.
*C23C 16/00* (2006.01)
*C23C 16/08* (2006.01)

(52) U.S. Cl.
USPC .................................................. 427/255.39

(58) Field of Classification Search ... 427/248.1–255.27
See application file for complete search history.

(56) References Cited

U.S. PATENT DOCUMENTS

| | | | | |
|---|---|---|---|---|
| 4,696,837 A | * | 9/1987 | Lindner | 427/255.35 |
| 4,724,159 A | * | 2/1988 | Yamazaki | 427/568 |
| 5,124,180 A | * | 6/1992 | Proscia | 427/255.35 |
| 5,563,105 A | * | 10/1996 | Dobuzinsky et al. | 438/784 |
| 5,820,664 A | * | 10/1998 | Gardiner et al. | 106/287.17 |
| 6,235,343 B1 | | 5/2001 | Joret et al. | |
| 6,436,541 B1 | | 8/2002 | Sopko et al. | |
| 2003/0162037 A1 | | 8/2003 | Russo et al. | |
| 2005/0213185 A1 | * | 9/2005 | Garg et al. | 359/265 |
| 2008/0185099 A1 | | 8/2008 | Bujard et al. | |

OTHER PUBLICATIONS

PCT International Search Report and Written Opinion mailed Nov. 18, 2010, International Application No. PCT/US2010/19662, 7 pages.

Fang et al., "Effect of Freon flow rate on tin oxide thin films deposited by chemical vapor deposition", Applied Surface Science, vol. 220, Iss. 1-4, pp. 175-180, Dec. 30, 2003.

Proscia, et al., "Properties of fluorine-doped tin oxide films produced by atmospheric pressure chemical vapor deposition from tetramethyltin, bromotrifluoromethane and oxygen", Thin Solid Films, vol. 214, Iss. 2, pp. 175-187, Jul. 15, 1992.

* cited by examiner

*Primary Examiner* — Michael Cleveland
*Assistant Examiner* — Michael G Miller
(74) *Attorney, Agent, or Firm* — Paul J. White; J. Patrick Kendrick

(57) ABSTRACT

Methods of forming a conductive fluorine-doped metal oxide layer on a substrate by chemical vapor deposition are described. The methods may include heating the substrate in a processing chamber, and introducing a metal-containing precursor and a fluorine-containing precursor to the processing chamber. The methods may also include adding an oxygen-containing precursor to the processing chamber. The precursors are reacted to deposit the fluorine-doped metal oxide layer on the substrate. Methods may also include forming the conductive fluorine-doped metal oxide layer by plasma-assisted chemical vapor deposition. These methods may include providing the substrate in a processing chamber, and introducing a metal-containing precursor, and a fluorine-containing precursor to the processing chamber. A plasma may be formed that includes species from the metal-containing precursor and the fluorine-containing precursor. The species may react to deposit the fluorine-doped metal oxide layer on the substrate.

10 Claims, 3 Drawing Sheets

FLUORINE COMPOUNDS FOR DOPING CONDUCTIVE OXIDE THIN FILMS

CROSS-REFERENCE TO RELATED APPLICATIONS

This application claims the benefit of U.S. Prov. Patent Appl. No. 61/244,305 filed Sep. 21, 2009, and entitled "FLUORINE COMPOUNDS FOR DOPING CONDUCTIVE OXIDE THIN FILMS," which is incorporated herein by reference in its entirely for all purposes.

STATEMENT AS TO RIGHTS TO INVENTIONS MADE UNDER FEDERALLY SPONSORED RESEARCH AND DEVELOPMENT

This application includes inventions made under Contract No. DE-AC36-08GO28308 between the Unites States Department of Energy and the National Renewable Energy Laboratory, managed and operated by the Alliance for Sustainable Energy, LLC. This application also includes invention made under Cooperative Research and Development Agreement No. CRD 09-284 between Matheson Tri-Gas, Inc., and the National Renewable Energy Laboratory. The Government has certain rights in these inventions.

BACKGROUND

Transparent conductive-oxide coatings are used in many types of electronics devices where an electrically conductive channel is formed on a translucent substrate such as a flat panel display screen or photo-voltaic solar cell. One type of transparent conductive-oxide coating is made from tin oxide ($SnO_2$) that is formed on the translucent substrate from a gas or liquid precursor containing tin. The oxygen component may already be present in the tin precursor, or may be supplied separately by exposing the tin precursor to an oxygen-containing gas such as air. The fluidity of the tin precursor permits efficient coating and patterning of the tin oxide film on the substrate.

The conductivity of tin oxide films are significantly increased when specific dopants are included when the film is being formed. Originally, antimony was added to tin oxide films to increase their conductivity. Later it was discovered that fluorine also increased conductivity, while also maintaining the high transparency of the tin oxide film. The combination of improved electrical conductivity and transparency of fluorine-doped tin oxide films (FTOs) favor these films for solar cell applications. Fluorine-doping is also used to improve the electrical, optical, and other properties of materials such as zinc oxides, cadmium oxides, silicon oxides, indium-tin oxides, Pb—Zr—Ti oxides and other piezo-electric ceramics, carbon, silicon nitrides, and super-conducting materials such as mercury-barium oxides, and mercury-barium-copper oxides.

However, there are still challenges for effectively and efficiently incorporating a fluorine dopant in tin oxide thin films. Some organic-fluorine precursors can contaminate the FTO with excess carbon that can reduce both the electrical conductivity and transparency of the film. The combination of fluorine with oxygen, or other halogens (e.g., chlorine) can create oxidized build-up and corrosive deposits on the substrate. Thus, the choice of the fluorine dopant can have unpredictable and deleterious effects on the deposited FTO film.

Fluorine-containing precursors can also be highly toxic and corrosive, creating safety and environmental concerns about their use on a commercial scale. The health, safety, and handling risks of molecular fluorine ($F_2$) and hydrogen fluoride (HF) are well known. Many chloro- and bromo-fluorocarbons have been banned for commercial uses due to their stratospheric ozone depleting and global warming properties when released into the atmosphere.

Corrosive fluorine-containing precursors can also rapidly contaminate FTO film fabrication equipment so that it requires frequent and time-consuming cleaning and refurbishing. Cleaning procedures often involve disassembling the equipment and contacting it with specialized cleaning solutions. This not only creates long delays before the equipment is operational again, but also generates a potentially toxic and corrosive source of spent cleaning fluids that is expensive to dispose. Thus, there is a need for effective fluorine dopant precursors in FTO film production with reduced health, handling and environmental risks compared currently used precursors. Such precursors, as well as their use in fabricating FTO films, are described here.

BRIEF SUMMARY

Fluorine-containing precursors are described for F-doping transparent conductive oxide films, including tin-oxide films (e.g., FTO films). These fluorine-containing precursors may further include carbon, oxygen, nitrogen, metals (e.g., tin), and/or other halogens. Examples of these fluorine-containing precursors include fluoro-organic compounds such as halocarbons and hydrofluorinated ethers; oxo-flourine compounds such as $F_2O$, and sulfur-fluorine compounds such as $SF_4$, $SF_6$, and $S_2F_{10}$, among other fluorine-containing precursors. The fluorine-containing precursors may also include metal fluoride and metal-oxygen-fluoride compounds such as $SnF_4$, $SnCl_3F$, $SnOF_2$, and $SnO(CF_3)_2$.

Embodiments of the invention include methods of forming a conductive fluorine-doped metal oxide layer on a substrate by chemical vapor deposition. The methods may include the steps of heating the substrate in a processing chamber, and introducing a metal-containing precursor and a fluorine-containing precursor to the processing chamber. An oxygen-containing precursor may also be added to the processing chamber. The precursors are reacted to deposit the fluorine-doped metal oxide layer on the substrate.

Embodiments of the invention further include methods of forming a conductive fluorine-doped tin oxide layer on a substrate by chemical vapor deposition. The methods may include the steps of heating the substrate in a processing chamber, and introducing a tin-containing precursor and a fluorine-and-oxygen-containing precursor to the processing chamber. The precursors are reacted to deposit the fluorine-doped tin oxide layer on the substrate, wherein the fluorine-and-oxygen-containing precursor provides at least a portion of the oxygen in the fluorine-doped tin oxide layer.

Embodiments of the invention may still further include methods of forming a conductive fluorine-doped tin oxide layer on a substrate by spray pyrolysis. The methods may include the steps of heating the substrate and spraying it with liquids that react or decompose, or both, to incorporate fluorine into the tin oxide film.

Embodiments of the invention may also include methods of forming a conductive fluorine-doped metal oxide layer on a substrate by plasma-assisted chemical vapor deposition. The methods may include the steps of providing the substrate in a processing chamber, and introducing a metal-containing precursor, and a fluorine-containing precursor to the processing chamber. A plasma may be formed that includes species from the metal-containing precursor and the fluorine-containing precursor, and the species may react to deposit the fluorine-doped metal oxide layer on the substrate.

Additional embodiments and features are set forth in part in the description that follows, and in part will become apparent to those skilled in the art upon examination of the specification or may be learned by practicing the art. The features and advantages described may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION

Figure 1:
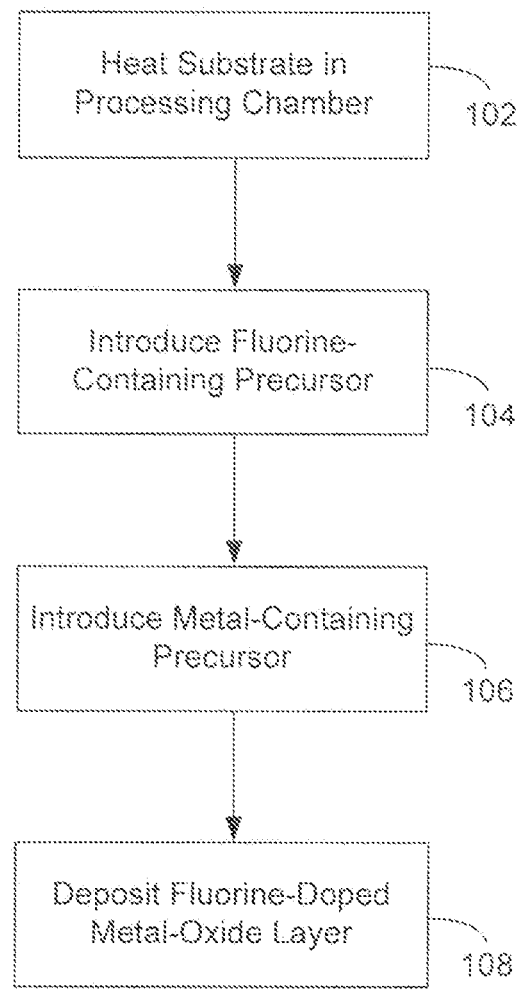
FIG. 1 shows selected steps in a method of forming a conductive fluorine-doped metal oxide layer on a substrate according to exemplary embodiments.

Methods of forming conductive, fluorine-doped metal oxide layers are described, as well as methods for in-situ cleaning of a processing chamber used to form the fluorine-doped metal oxide layers. Referring now to FIG. 1, selected steps in an exemplary method 100 of forming a conductive fluorine-doped metal oxide layer on a substrate are shown. The method 100 includes the step of heating a substrate in a processing chamber 102. The substrate may be a translucent substrate such as a glass plate or layer that is eventually incorporated into an electronic device component such as a photo-voltaic (PV) cell, or an electroluminescent display screen (e.g., light emitting diode (LED) displays, organic-LED (OLED) displays, plasma displays, etc.). The layers may also be incorporated into transportation industry applications (e.g., automotive and aircraft applications), as well as applications requiring low e-glass, among other applications. The processing chamber may be a chemical vapor deposition processing chamber.

The method 100 also includes introducing a metal-containing precursor 104, and a fluorine-containing precursor 106 to the processing chamber. The metal-containing precursor may contribute the metal portion of the metal-oxide layer deposited on the substrate. For example, the metal-containing precursor may be a tin-containing precursor when an FTO film is deposited on the substrate. The fluorine-containing precursor may include fluorine, either alone or in combination with other elements, such as carbon oxygen, nitrogen, sulfur, boron and/or other halogens, among other elements. The fluorine-containing precursor may also include one or more metal groups, including the metal deposited in the transparent conducting layer.

Specific examples of the fluorine-containing precursor may include, but are not limited to, carbon and fluorine containing compounds such as Halocarbons 116, 1216, 14, 218, 23, 32, 41, 4110, and/or C318. Additional examples may include $C_2BrF_3$, $CH_3F$, $CF_4$, $CF_2O$, $CHClF_2$, $C_2ClF_5$, $C_2ClF_3$, $CClF_3$, $CBr_2F_2$, $C_2Br_2F_4$, $CCl_2F_2$, $CHCl_2F$, $C_2Cl2F_4$, $C_2H_3ClF_2$, $C_2H_4F_2$, $C_2H_2F_2$, $CH_2F_2$, $C_3F_6O$, $C_2F_6$, $C_3F_6$, $C_4F_8$, $C_4F_8O$, $C_5F_8$, $C_2H_5F$, $C_4F_{10}$, $C_3F_8$, $C_2F_4$, $CCl_3F$, $C_2Cl_3F_3$, $CHF_3$, $C_2H_3F$, and $C_3F_7OCH_3$, among others. Further examples may include, but are not limited to, two-element compounds such as $BF_3$, $HF$, $F_2O$, $SiF_4$, $SF_6$, $SF_4$, $S_2F_{10}$, $WF_6$, $AsF_5$, $PF_3$, $BrF_5$, $BrF_3$, $IF_5$, $ClF_3$, $NF_3$, $N_2F_4$, $ClF$, $BrF$, $ClF_2N$, $FCl_2N$, $XeF_2$, $GeF_4$, and/or $ClF_3$, among others. Still further examples may include, but are not limited to, $F_2$, a mixture of $F_2$ and $O_2$, $F_3NO$, $FNO$, $COF_2$, $CF_3NO$, $CF_3OF$, $CF_3I$, $SClF_5$, $SO_2F_2$, $NCl_2F$, $NF_2Cl$, and/or $ClFO_3$. It should be appreciated that the fluorine-containing precursors may be provided to the processing chamber alone, or in a combination of two or more precursors.

Examples of fluorine-containing precursors may further include hydrofluorinated ethers (HFEs). Embodiments of HFEs include compounds of Formula (I):

$$R_1-O-R_2 \quad (I)$$

where $R_1$ and $R_2$ are independently a $C_1$-$C_4$ alkyl group which may have one or more hydrogens (—H) substituted with fluorine (—F) groups. When either $R_1$ or $R_2$ is an unsubstituted alkyl group with no fluorine groups, then the other group $R_1$ or $R_2$ has at least one hydrogen substituted with a fluorine group. Specific examples of HFEs include, but are not limited to, $C_4F_9OCH_3$, $C_4F_9OC_2H_5$, $CF_3OCH_3$, $CHF_2OCHF_2$, $CF_3CF_2OCH_3$, $CF_3OCHFCF_3$, and $CF_3COCBr_2H$, among others.

The oxygen component of the fluorine-doped, metal oxide layer may come from one or both of the fluorine-containing precursor or metal-containing precursor, and/or from a separate oxygen-containing precursor that is also introduced to the processing chamber. This separate oxygen containing precursor may include atomic oxygen (O), molecular oxygen ($O_2$), $O_3$, $N_2O$, $NO$, $NO_2$, $OH$, $H_2O$, $H_2O_2$, $SO$, $SO_2$, $CO_2$, $C_3H_7OH$, and/or $C_2H_5OH$ among other oxygen-containing compounds. The oxygen-containing precursor may be purified, or may be included in a mixture of compounds such as air.

The precursors may be reacted in the processing chamber to deposit the fluorine-doped metal oxide layer on the substrate 108. Embodiments include depositing a blanket film on the substrate or depositing a patterned film over exposed surfaces of the substrate. The reaction of the precursors may be initiated by a variety of processing chamber conditions. For example, the temperature in the processing chamber during a deposition event may be set to thermally activate and/or decompose the fluorine-containing precursor and/or the metal-containing precursor (e.g., about 400° C. to about 700° C.) to deposit the metal oxide layer on the substrate surface. In another example, the processing chamber may be configured to generate a plasma that includes the fluorine-containing precursor and/or the metal-containing precursor, which may be plasma activated to deposit the metal oxide layer on the substrate surface. When a separate oxygen-containing precursor is introduced to the processing chamber, this precursor may be thermally or plasma activated to form the metal-oxide layer.

Figure 2:
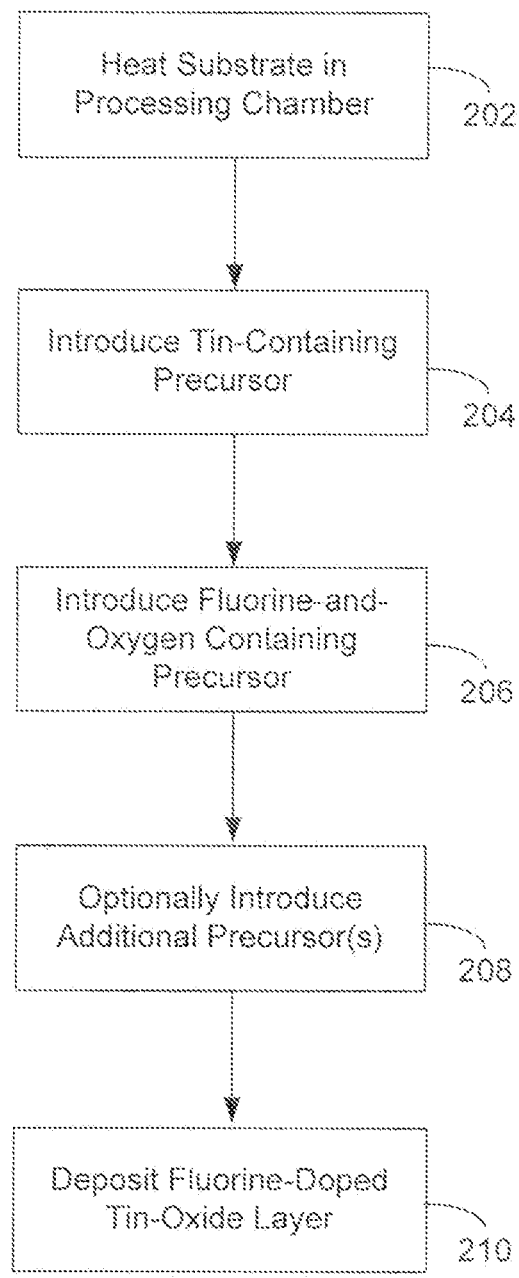
FIG. 2 shows selected steps in a method of forming a fluorine-doped tin-oxide layer according to exemplary embodiments.

Referring now to FIG. 2, a flowchart illustrating selected steps in a method 200 of forming a fluorine-doped tin oxide layer on substrate is shown. The method 200 includes the steps of heating the substrate in a processing chamber 202, and introducing a tin-containing precursor 204 and a fluorine-and-oxygen containing precursor 206 to the processing chamber.

Examples of a tin-containing precursor may include, but are not limited to, organo-tin compounds such as tetra-alkyl-tin compounds including tetramethyltin, tetraethyltin, monobutyltin oxide, dibutyltin oxide, mono/dibutyltin chlorides, dimethyltin dichloride, etc. Tin-containing precursors may also include, but are not limited to, halogenated tin compounds such as tin tetrachloride, tin tetrafluoride, tin trichlorofluoride ($SnCl_3F$), $SnCl_2F_2$, $SnIF_3$, $SnBrF_3$, etc. Tin-containing precursors may further include, but are not limited to, organo-tin compounds with perhalogenated alkyl groups (e.g., —$CF_3$) such as $Sn(CF_3)_4$. Tin-containing precursors may further include oxygen groups such as $SnOF_2$ and $SnO(CF_3)_2$, $SnOClF$, $SnOIF$, and $SnOBrF$, among others. Embodiments include diluting the tin-containing precursor in a carrier gas that may be an inert gas (e.g., $N_2$, He, Ar, etc.) or a gas with a combination of inert and reactive compounds such as air.

Examples of the fluorine-and-oxygen containing precursor include $F_2O$, and mixtures of $F_2$ and/or HF and $O_2$ gases. Examples may also include $F_3NO$, FNO, $COF_2$, $CF_3NO$, $CF_3OF$, $SO_2F_2$, and/or $ClFO_3$. Mixtures of two or more compounds may be used to make the fluorine-and-oxygen containing precursor. In still additional embodiments, either the fluorine or the oxygen in the fluorine-and-oxygen containing precursor may be supplied by the tin-containing precursor while a second precursor supplies the other element. For example, the fluorine in a fluorine-and-oxygen containing precursor may be supplied by $SnF_4$ while the oxygen may be supplied by a separate flow of molecular oxygen gas ($O_2$).

Embodiments may also include optionally adding additional precursors to the processing chamber 208. These precursors may include oxygen-containing precursors, halogen-containing precursors, additional tin-containing precursors, etc. The formulas below provide some examples of combinations of precursors that may be used to form the fluorine-doped tin oxide layer:

$SnF_4+O_2$ $SnF_4+O_2+Sn(CH_3)_4$ $SnF_4+O_2+Sn(CH_3)_4+CBrF_3$ $SnF_4+O_2+Sn(CH_3)_4+ClF$ $SnF_4+O_2+Sn(CH_3)_4+NClF2$ $SnF_4+O_2+Sn(CH_3)_4+HFE$ (hydrofluoroethers)

$SnOF2+O2$ $SnOF_2+O_2+Sn(CH_3)_4$ $SnOF_2+O_2+Sn(CH_3)_4+ClF$ $SnOF_2+O_2+Sn(CH_3)_4+NClF_2$ $SnF_4+SnOF_2+O_2$ $SnF_4+SnOF_2+O_2+CBrF_3$

The precursors may be reacted in the processing chamber to deposit the fluorine-doped tin oxide layer on the substrate 210. The process chamber may be configured to facilitate the reaction of the precursors through thermal activation, plasma activation, and/or the pyrolysis of one or more precursor at the substrate surface, among other reaction mechanisms. Depending on the selection of the tin-containing precursor and the fluorine-and-oxygen containing precursor, at least a portion of the oxygen and/or fluorine in the deposited layer may come from this source. For example, the fluorine-and-oxygen-containing precursor may provide at least a portion of the oxygen in the deposited fluorine-doped tin-oxide layer.

Embodiments may also include methods of forming a conductive fluorine-doped metal-oxide layer on a substrate using a single precursor that contains fluorine, the metal, and oxygen. These methods (not shown) may include the steps of heating the substrate in a processing chamber, and introducing a fluorine-tin-and-oxygen containing precursor to the chamber. The precursor may be subjected to an environment in the processing chamber where it is activated and/or decomposed to form the fluorine-doped-metal oxide layer on the substrate. The processing chamber may be configured to expose the precursor to thermal and/or plasma conditions that cause it to form the fluorine-doped metal-oxide layer. Examples of such precursors for the formation of a fluorine-doped tin-oxide layer may include $SnOF_2$, $SnO(CF_3)_2$, $SnOClF$, $SnOIF$, and $SnOBrF$, among other precursors.

Figure 3:
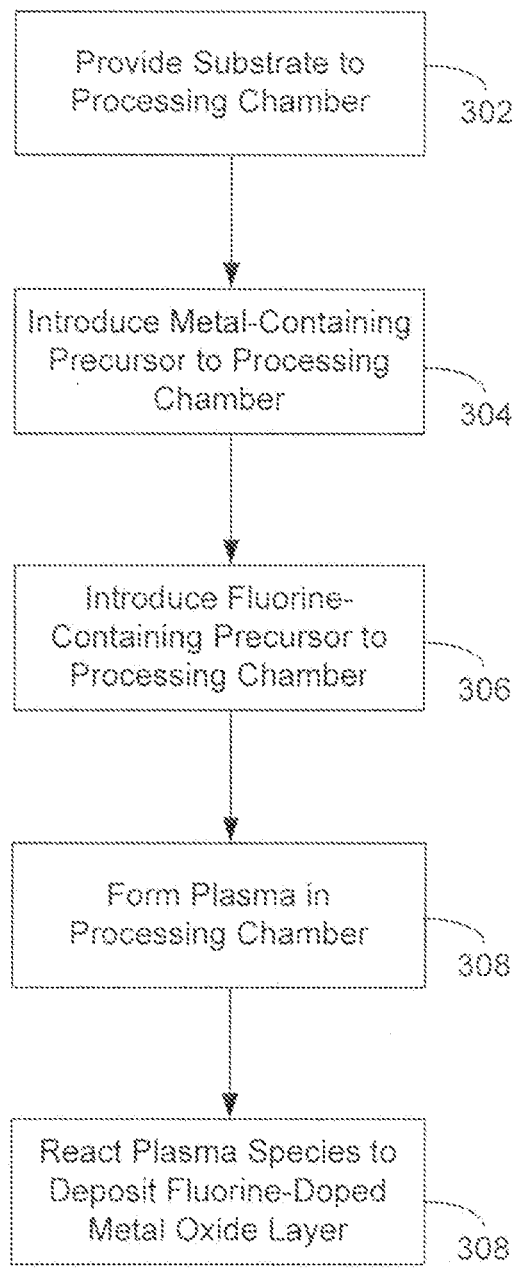
FIG. 3 shows selected steps in a method of forming a fluorine-doped metal-oxide layer with plasma-assisted chemical vapor deposition according to exemplary embodiments.

FIG. 3 shows a flowchart illustrating selected steps in a method 300 of forming a fluorine-doped metal-oxide layer with plasma-assisted chemical vapor deposition according to embodiments of the invention. The method may include the step of providing a substrate to a processing chamber 302. The processing chamber may be configured to generate a plasma from one or more precursor gases introduced to the chamber. The method may further include introducing a metal-containing precursor 304, and a fluorine-containing precursor 306 to the processing chamber. A plasma may be formed in the processing chamber 308, where the plasma includes species from the metal-containing precursor and fluorine-containing precursor. The species may be the precursors themselves in a activated (i.e., more reactive) state, and/or radical and ion fragments of the starting precursors. The species are reacted to deposit the fluorine-doped metal oxide layer on the substrate 310.

Having described several embodiments, it will be recognized by those of skill in the art that various modifications, alternative constructions, and equivalents may be used without departing from the spirit of the application. Additionally, a number of well-known processes and elements have not been described in order to avoid unnecessarily obscuring the present application. Accordingly, the above description should not be taken as limiting the scope of the application.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a conductive fluorine-doped metal oxide layer on a substrate by chemical vapor deposition, the method comprising:

heating the substrate in a processing chamber;

introducing a metal-containing precursor, and a fluorine-containing precursor to the processing chamber; and reacting the precursors to deposit the fluorine-doped metal oxide layer on the substrate;

wherein the fluorine-containing precursor is a hydrofluorinated ether having the formula;

$$R_1\text{---}O\text{---}R2$$

wherein $R_1$ and $R_2$ are independently a $C_1$-$C_4$ alkyl group which may have one or more hydrogens (—H) substituted with fluorine (—F) groups, and wherein if either $R_1$ or $R_2$ is an unsubstituted alkyl group with no fluorine groups, then the other group $R_1$ or $R_2$ has at least one hydrogen substituted with a fluorine group; and wherein the hydrofluorinated ether is selected from the group consisting of $C_3F_7OCH_3$, $C_4F_9OCH_3$, $C_4F_9OC_2H_5$, $CF_3OCH_3$, $CHF_2OCHF_2$, $CF_3CF_2OCH_3$, $CF_3OCHFCF_3$, and $CF_3COCBr_2H$.

2. The method of claim 1, wherein the method further comprises introducing an oxygen-containing precursor to the processing chamber.

3. The method of claim 1, wherein the fluorine-containing precursor is selected from the group consisting of Halocarbons 116, 1216, 14, 218, 23, 32, 41, 4110, and C318; $C_2BrF_3$, $CH_3F$, $CF_4$, $CF_2O$, $CHClF_2$, $C_2ClF_5$, $C_2ClF_3$, $CClF_3$, $CBr_2F_2$, $C_2Br_2F_4$, $CCl_2F_2$, $CHCl_2F$, $C_2Cl_2F_4$, $C_2H_3ClF_2$, $C_2H_4F_2$, $C_2H_2F_2$, $CH_2F_2$, $C_3F_7OCH_3$, $C_3F_6O$, $C_2F_6$, $C_3F_6$, $C_4F_8$, $C_4F_8O$, $C_5F_8$, $C_2H_5F$, $C_4F_{10}$, $C_3F_8$, $C_2F_4$, $CCl_3F$, $C_2Cl_3F_3$, $CHF_3$, $C_2H_3F$, $BF_3$, $HF$, $F_2$, a mixture of $F_2$ and $O_2$, $F_2O$, $F_3NO$, $FNO$, $COF_2$, $CF_3NO$, $CF_3OF$, $CF_3I$, $SiF_4$, $SF_6$, $SF_4$, $SClF_5$, $SO_2F_2$, $S_2F_{10}$, $WF_6$, $AsF_5$, $GeF_4$, $PF_3$, $BrF_5$, $BrF_3$, $IF_5$, $ClF_3$, $NF_3$, $N_2F_4$, $NCl_2F$, $NF_2Cl$, $ClF$, $BrF$, $ClFO_3$, $ClF_3$, and $XeF_2$.

4. The method of claim 1, wherein the fluorine-containing precursor is a fluorine-and-tin-containing precursor selected from the group consist $SnF_4$, $SnCl_3F$, $SnOF_2$, $SnO(CF_3)_2$, wherein the tin comprises at least a portion of the metal in the fluorine-doped metal oxide layer deposited on the substrate.

5. The method of claim 1, wherein the fluorine-containing precursor comprises a fluorine and oxygen-containing precursor.

6. The method of claim 5, wherein the fluorine and oxygen-containing precursor comprises $F_2O$.

7. The method of claim 6, wherein the F2O provides at least a portion of the oxygen for the fluorine-doped metal oxide layer deposited on the substrate.

8. The method of claim 1, wherein the metal-containing precursor comprises tin, indium, zirconium, cadmium, silicon, copper, lead, titanium, mercury, barium, or zinc.

9. The method of claim 1, wherein the metal-containing precursor comprises an organo-tin compound.

10. The method of claim 9, wherein the organo-tin compound is selected from the group consisting of tin tetrachloride and tetramethyltin.

* * * * *